United States Patent
Ruppert

(10) Patent No.: US 6,731,112 B2
(45) Date of Patent: May 4, 2004

(54) MRI USING 3D GRADIENT AND SPIN ECHO MRI PULSE SEQUENCES WITH CYLINDRICAL K-SPACE TRAJECTORIES AT CONSTANT FREQUENCY OF THE OSCILLATING GRADIENTS

(76) Inventor: Kai Ruppert, 58 Holliday Dr., Novato, CA (US) 94949

( * ) Notice: Subject to any disclaimer, the term of this patent is extended or adjusted under 35 U.S.C. 154(b) by 0 days.

(21) Appl. No.: 10/153,961

(22) Filed: May 22, 2002

(65) Prior Publication Data
US 2003/0102865 A1 Jun. 5, 2003

Related U.S. Application Data
(60) Provisional application No. 60/292,584, filed on May 22, 2001.

(51) Int. Cl.⁷ .................................................. G01V 3/00
(52) U.S. Cl. ........................ 324/307; 324/309; 324/312; 324/314; 324/300
(58) Field of Search ................................. 324/309, 307, 324/312, 314, 300; 600/422

(56) References Cited

U.S. PATENT DOCUMENTS

| | | | | |
|---|---|---|---|---|
| 5,361,028 A | * | 11/1994 | Kanayama | 324/309 |
| 5,561,370 A | | 10/1996 | Fuderer | 324/309 |
| 5,952,827 A | * | 9/1999 | Feinberg | 324/309 |
| 6,476,607 B1 | * | 11/2002 | Dannels et al. | 324/309 |

FOREIGN PATENT DOCUMENTS

| | | | |
|---|---|---|---|
| EP | 0 177 990 | * | 4/1986 |
| EP | 0 543 468 | * | 5/1993 |

* cited by examiner

Primary Examiner—Brij B. Shrivastav
(74) Attorney, Agent, or Firm—Cooper & Dunham LLP

(57) ABSTRACT

MR imaging with gradient oscillations that are essentially at the same frequency to reduce off-resonance effects. Frequencies that are sufficiently close to each other to reduce such effects compared with known approaches are considered essentially the same frequency.

4 Claims, 4 Drawing Sheets

MRI USING 3D GRADIENT AND SPIN ECHO MRI PULSE SEQUENCES WITH CYLINDRICAL K-SPACE TRAJECTORIES AT CONSTANT FREQUENCY OF THE OSCILLATING GRADIENTS

REFERENCE TO RELATED APPLICATION

This present application claims the benefit of provisional Application Serial No. 60/292,584, filed on May 22, 2001, which is hereby incorporated herein by reference

FIELD

This patent specification is in the field of magnetic resonance imaging (MRI) and more particularly in the field of 3D interleaved-cylindrical trajectory imaging.

BACKGROUND AND SUMMARY

An interleaved-cylindrical k-space trajectory can be envisioned as an arrangement of a number of individual helices (the "interleaves") as illustrated in FIGS. 1a and 1b, where FIG. 1a illustrates a top view of a starting position for the interleaves, with constant angular and radial steps, and FIG. 1b illustrates a side view of a single interleave with four turns. A helix such as seen in FIG. 1b can be generated in MRI by two oscillating and, with respect to each other, phase-shifted gradients in combination with a constant gradient in the third dimension. Increasing the amplitude of the oscillating gradients increases the radius of the traced helix. By varying the helical radius by a fixed increment and arranging the helices with identical radii along the circumference of the trajectory projection along the direction of the constant gradient, a set of concentric cylinders is formed, as seen in FIG. 1a. An approach of this type is discussed in U.S. Pat. No. 5,561,370, which is hereby incorporated by reference in this patent specification. The gradients can be along directions different from those illustrated.

This patent specification discloses a new approach that reduces blurring and distortions. While U.S. Pat. No. 5,561,370 illustrates in FIG. 8 oscillating gradients Gx and Gy that differ in both amplitude and in oscillating frequency for different interleaves, the new approach disclosed in this patent specification preferably maintains an essentially fixed oscillation frequency for all interleaves, independent of the amplitude of the oscillating gradient. As a result, the data points in a given slice perpendicular to the z-axis in Gif. 1b are acquired at essentially the same time relative to the exciting or refocusing radio frequency (RF) pulse(s). A consequence of this is that off-resonance signal sources appear as shifted along the z-direction in the image data set but are not as blurred or distorted as in the case of known MRI pulse sequences employing oscillating gradients.

FIGS. 1a and 1b illustrate a case in which the oscillating gradients conform to sinusoidal waveforms, which gives rise to circular projections. However, other waveforms can be used in accordance with this patent specification such as, without limitation, trapezoidal, triangular, and other waveforms.

BRIEF DESCRIPTION OF THE DRAWINGS

FIG. 1a is a top view of a starting position for the interleaves with constant angular and radial steps and FIG. 1b is a side view of the trajectory for a single interleave with four turns. All phase errors are constant across k-space (x,y) and only accumulate linearly along z.

DETAILED DESCRIPTION OF PREFERRED EMBODIMENTS

Figure 1:
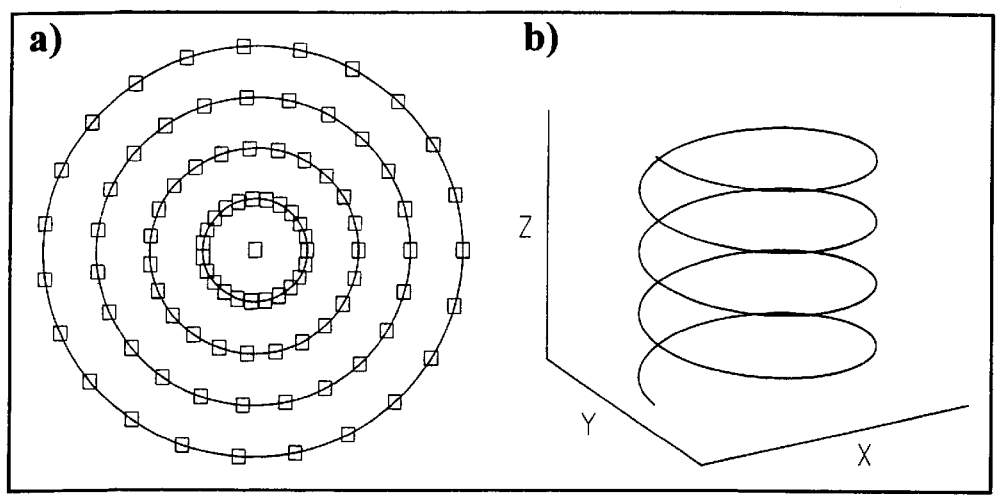
FIGS. 1a and 1b illustrate a 3D interleaved-cylindrical trajectory, where
Figure 2:
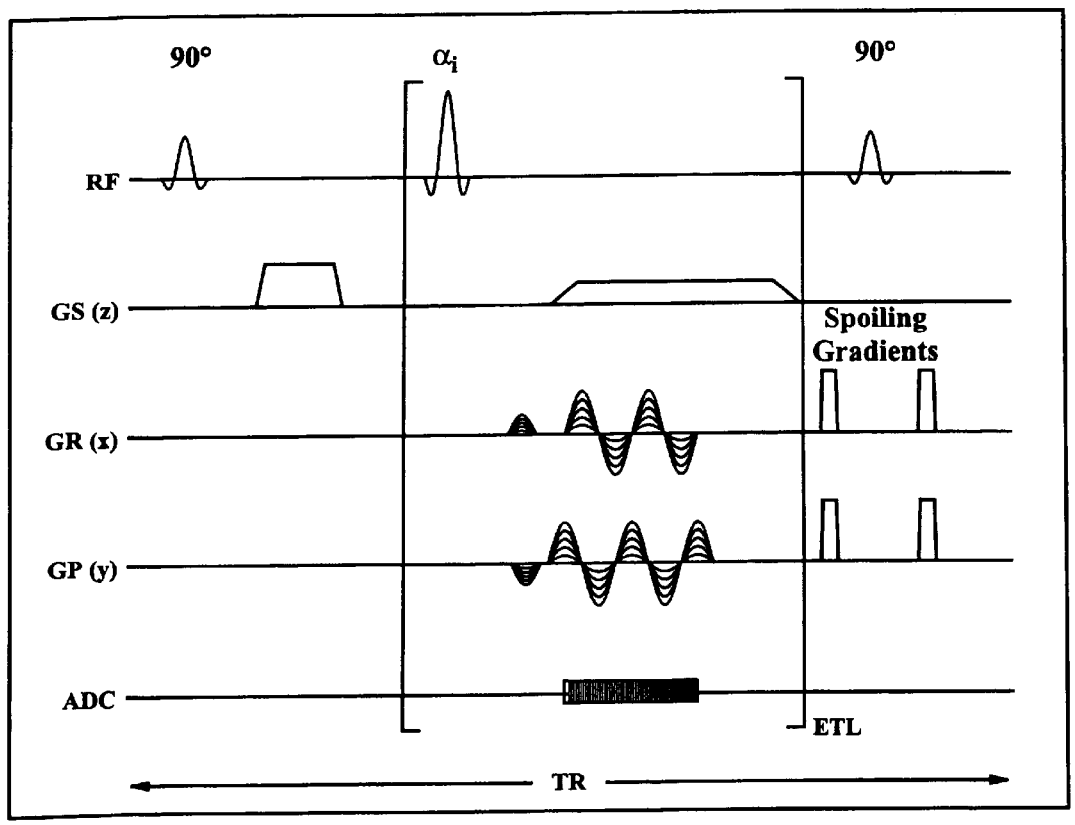
FIG. 2 is a timing diagram for a 3D spin-echo pulse sequence with an interleaved-cylindrical k-space trajectory where all gradient oscillations are performed at a fixed frequency, thereby leaving the accumulated phase errors invariant along the x- and y-axis and reducing intensity smearing or distortions in the resulting SE images.

A trajectory in accordance with preferred embodiments can be implemented in the form of a gradient-recalled-echo (GRE) as well as a spin-echo (SE) train MR pulse sequence. In the case of an SE implementation, as illustrated in FIG. 2, the excitation radio frequency (RF) pulse is applied along an axis perpendicular to all subsequent refocusing RF pulses to form a CPMG spin-echo train. Before each refocusing RF pulse $\alpha_i$, the trajectory returns to the origin in the $k_x$–$k_y$ plane to prevent the encoding of higher-order echoes. After the acquisition of ETL echoes, preferably a spoiling –90°-spoiling sequence of gradients is applied as illustrated in FIG. 2 to allow the magnetization to relax longitudinally in a defined fashion. The spoiling gradients reduce the amount of image artifacts but can be omitted, if preferred.

Figure 3:
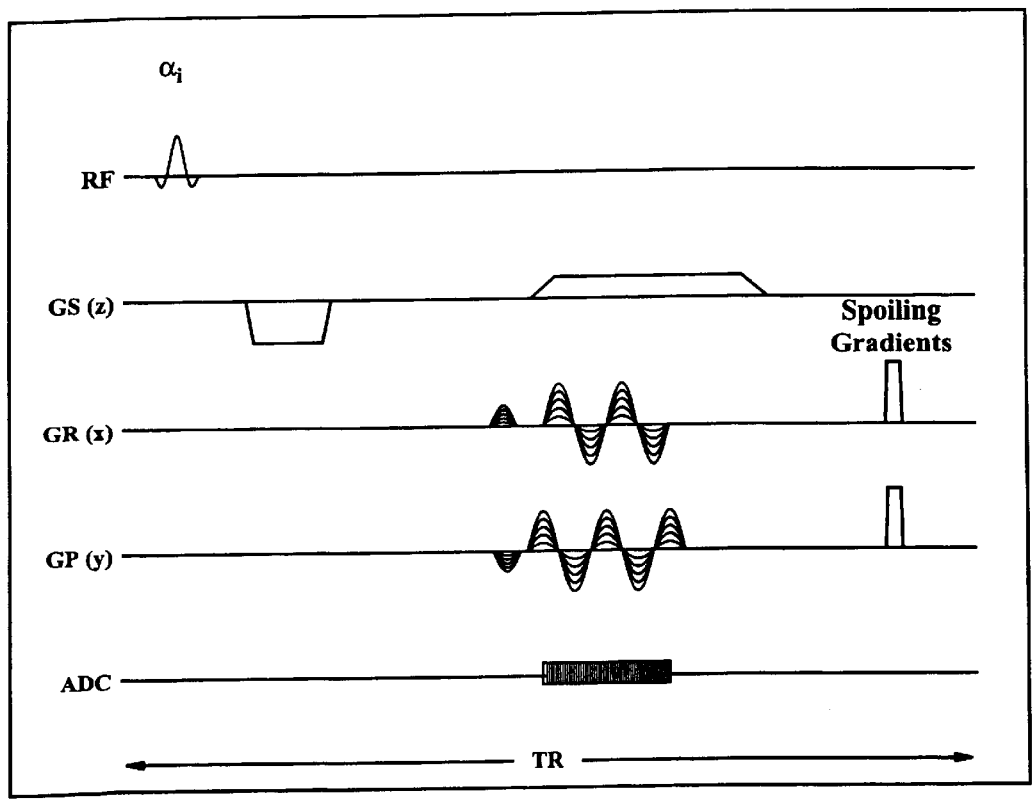
FIG. 3 is a timing diagram for a 3D gradient-echo pulse sequence with an interleaved-cylindrical k-space trajectory where all gradient oscillations are performed at a fixed frequency, thereby leaving the accumulated phase errors invariant along the x- and y-axis and reducing intensity smearing or distortions in the GRE resulting images.

A gradient-recalled-echo (GRE) implementation is illustrated in FIG. 3. The GRE implementation is otherwise similar to the SE implementation, so similar aspects will not be re-described, but is much simplified. As with the SE case, the spoiling gradient illustrated in FIG. 3 is preferred but not essential. It can be desirable for a general improvement in sequence robustness.

In either case, SE or GRE, the number of revolutions per interleave is determined by the purpose of the pulse sequence and overall timing and image quality constraints, as will be apparent to persons skilled in the technology who have access to this disclosure.

A common problem with k-space trajectories generated with oscillating readout gradients is their high sensitivity to off-resonance effects. This is usually caused by a combination of long sampling periods and an unfavorable distribution of the accumulated phase error in k-space. A significant advantage of the interleaved-cylindrical trajectory approach disclosed in this patent specification, on the other hand, is the use of a linear gradient along the z-axis with an essentially identical amplitude during all sampling periods. The consequence is a linear phase accumulation in the z-direction that translates into a position shift of the off-resonance tissue. This position shift can be considered a benign artifact not requiring additional correction, as distinguished from the more burdensome intensity smearing across the whole image in known methods.

Figure 4:
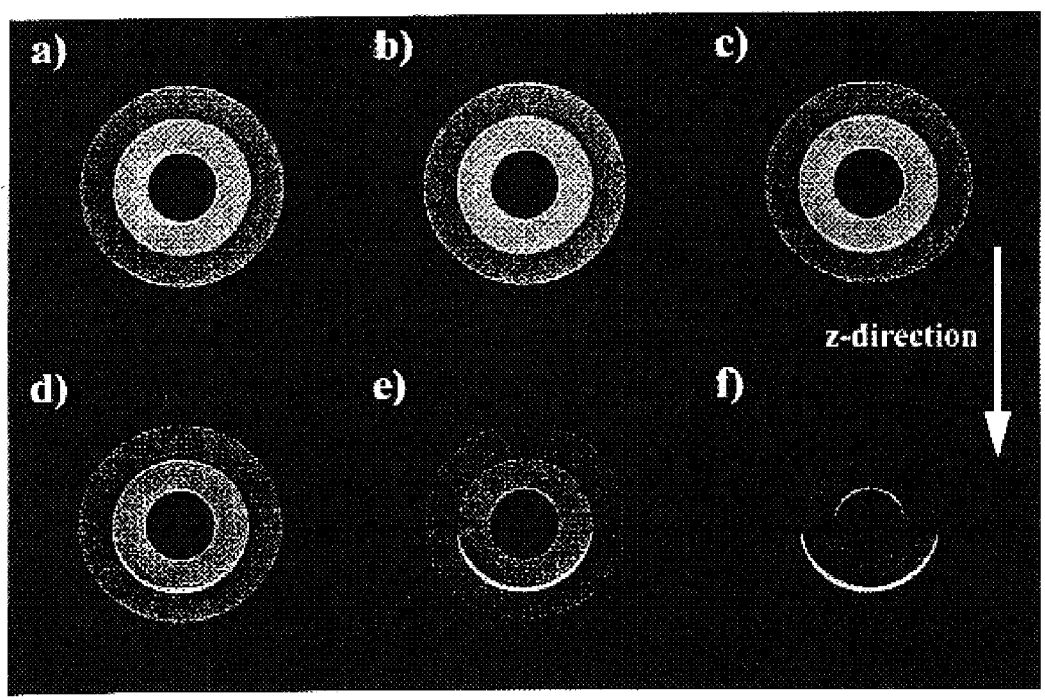
FIG. 4 illustrates a simulation of a T1-weighted, single-echo interleaved-cylindrical sequence for a set of concentric shells with various frequency offsets of the middle shell. The image labels correspond to offsets of a) 0 Hz, b) 50 Hz, c) 100 Hz, d) 200 Hz, e) 500 Hz, and f) 1000 Hz.

FIG. 4 illustrates off-resonance behavior of an interleaved-cylindrical trajectory approach in accordance with preferred embodiments disclosed in this patent specification. This example involves a simulation of a T1-weighted, single-echo sequence (TR=300 ms, bandwidth −65 Hz). In a set of concentric shells, the frequency offset of the middle shell was varied between 0 Hz and 1000 Hz and images were generated for offsets of a) 0 Hz, b) 50 Hz, c) 100 Hz, d) 200 Hz, e) 500 Hz, and f) 1000 Hz. The resulting error causes the middle shell to appear shifted along the illustrated z-direction in the coronal slices. Where the shifted shell overlaps with the unshifted shells, the image intensity increases and bright bands appear along the edges. Nevertheless, the shifted shell is still well-defined and no intensity smearing is apparent.

Thus, this patent specification teaches MR imaging in which gradient oscillations are performed at an essentially fixed frequency to reduce sensitivity to off-resonance effects, or at frequencies that differ but are sufficiently close to each other to significantly reduce off-resonance effects compared with proposals such as in U.S. Pat. No. 5,561,370.

What is claimed is:

1. A method of spin echo (SE) MR imaging comprising:
   acquiring spin echo MR imaging data in a process comprising applying at least one excitation RF pulse to a subject and subsequently applying thereto at least one refocusing RF pulse, wherein the excitation RF pulse is along an axis essentially perpendicular to the at least one refocusing RF pulse, to form a CPMG spin echo train, said acquisition comprising applying gradient oscillations at essentially the same frequency to reduce off-resonance effects;
   causing a trajectory return to an origin of $k_x$–$k_y$ space to prevent or reduce encoding of higher order echoes; and
   processing so acquired MR imaging data for form MR images.

2. A method as in claim 1 further including applying to the subject a 90° spoiling sequence of gradients after acquisition of ETL echoes, to thereby allow magnetization to relax longitudinally and reduce image artifacts.

3. A method of gradient-recall-echo (GRE) MR imaging comprising:
   acquiring GRE MR imaging data in a process comprising applying at least one excitation RF pulse to a subject and applying gradient oscillations at essentially the same frequency to reduce off-resonance effects;
   causing a trajectory return to an origin of $k_x$–$k_y$ space to prevent or reduce encoding of higher order echoes; and
   processing so acquired MR imaging data for form MR images.

4. A method as in claim 3 further including applying at least one spoiling gradient to improve sequence robustness.

* * * * *